(12) United States Patent
Fung et al.

(10) Patent No.: US 7,629,825 B1
(45) Date of Patent: Dec. 8, 2009

(54) EFFICIENT DELAY ELEMENTS

(75) Inventors: Ryan Fung, Mississauga (CA); Vaughn Betz, Toronto (CA)

(73) Assignee: Altera Corporation, San Jose, CA (US)

( * ) Notice: Subject to any disclaimer, the term of this patent is extended or adjusted under 35 U.S.C. 154(b) by 92 days.

(21) Appl. No.: 11/549,427

(22) Filed: Oct. 13, 2006

(51) Int. Cl.
*H03H 11/26* (2006.01)

(52) U.S. Cl. ...................... 327/276; 327/269

(58) Field of Classification Search ............. None
See application file for complete search history.

(56) References Cited

U.S. PATENT DOCUMENTS

| | | | | |
|---|---|---|---|---|
| 5,389,843 A * | 2/1995 | McKinney | ................. | 327/276 |
| 5,815,016 A * | 9/1998 | Erickson | ................. | 327/158 |
| 6,100,736 A * | 8/2000 | Wu et al. | ................. | 327/159 |
| 6,774,693 B2 * | 8/2004 | Carr | ................. | 327/276 |
| 6,847,246 B1 * | 1/2005 | Kaviani et al. | ................. | 327/276 |
| 6,906,569 B2 * | 6/2005 | Brox | ................. | 327/276 |

* cited by examiner

*Primary Examiner*—An T Luu
(74) *Attorney, Agent, or Firm*—Townsend and Townsend and Crew LLP; David B. Raczkowski

(57) ABSTRACT

Circuits, methods, and apparatus for delaying signals in a power and area efficient manner are provided. A gating element within a stage of a programmable delay element suppresses an operation of other stages of the delay element. A programmable delay has components with differing delays that may be combined to give flexibility in choices for delay increments while minimizing the area of the delay element. A delay element is shared between different signal paths, for example, to reduce the number of delay elements or to allow utilizing unused delay elements of other signal paths.

11 Claims, 15 Drawing Sheets

EFFICIENT DELAY ELEMENTS

BACKGROUND

The present invention generally relates to delay elements within integrated or logic circuits and more particularly to area and power efficient delay elements.

Delay elements are common in modern integrated circuits, such as programmable logic devices (PLD) and application specific integrated circuits (ASIC). One use of delay elements is to control the timing of signals, such as the timing between data signals and clock signals. For example, it is sometimes favorable to slow down data signals to prevent data corruption at storage elements before the appropriate data can be successfully captured. Also, it is sometimes favorable to slow down clock signals to storage elements to give data signals more time to reach those storage elements. Additionally, signals may be slowed down to reduce the skew between signal paths so as to equalize the propagation delay between different signal paths or to achieve a requested skew between the signal paths.

In order to slow down signals, there are two general approaches, which may be used in combination: using many logic or routing elements along the signal path; or using slower logic or routing elements along the signal path. The latter approach is generally favored when it is feasible because it wastes fewer elements. Delay elements are an example of these slower elements that can be efficiently used to slow down signal paths. Delay elements are often programmable so that the amount of delay they add to a signal path can be controlled. Programmability is useful because it is often important to achieve a particular range of delays rather than any delay greater than a specified value. Consequently, due to their usefulness and efficiency, programmable delay elements are common in modern PLDs, especially in input and output (10) blocks.

As delay elements occur frequently, the amount of area and energy used by the delay elements can be quite large. The area used for delay elements contributes to the manufacturing cost of a circuit, as well as to additional design costs. Thus, it would be beneficial for the delay elements to be as small as possible while potentially achieving the same level of programmability. Also, the energy used by a delay element contributes to the operating cost of a circuit, which would also preferably be minimized.

Thus, what are needed are circuits, methods, and apparatus for providing area and energy efficient delay elements.

SUMMARY

Accordingly, embodiments of the present invention provide circuits, methods and apparatus for delaying signals while using less area and less power than typical delay elements.

In one exemplary embodiment of the present invention, an integrated circuit with a programmable delay element, which utilizes gating elements to suppress operation of parts of the programmable delay element, is provided. The programmable delay element has one or more stages, which may be composed of delay sub-elements. The stages are arranged in series. Between each delay stage, there is a delay tap. There is also one delay tap at the beginning and one at the end of the delay stages.

The delay taps are used as inputs to a signal selection circuit that has an output selectively coupled with its inputs based on one or more data select input signals. Within at least one delay stage, there is a gating element that is capable of suppressing an operation of at least one of the delay stages. Other stages may have a gating element as well. The gating element may occur immediately after one of the delay taps, or it may occur in other places within a stage. In one embodiment, the gating element is a NAND gate.

The gating element may be controlled by a gating signal for turning off and on the operation of the stages after the gating element. In one embodiment, the gating signals are derived from the data select inputs of the signal selection circuit. In an embodiment where the signal selection circuit is fully decoded, each gating signal is equivalent to one of the data select inputs. In another embodiment, the gating signals are derived from values stored in a memory element.

The delay sub-elements may be, for example, inverters or buffers. The amount of delay of a stage may be variable, set, or calibrated to any particular value. According to an aspect of the embodiment with a variable delay stage, a sub-element of that delay stage may be a current-starved inverter, a buffer with a high capacitive load, or a programmable load. There may be any number of gating elements within the stages of the delay elements.

In another exemplary embodiment of the present invention, an integrated circuit with a programmable delay element, which utilizes different components arranged in series to save area, is provided. Each component has one or more delay stages, which may be composed of delay sub-elements. The stages are arranged in series. Between each delay stage, there is a delay tap. There is also one delay tap at the beginning, a first delay tap, and one at the end, a final delay tap.

The delay taps are used as inputs to a signal selection circuit that has an output selectively coupled with the inputs based on one or more data select input signals. The output of the signal selection circuit of the first component is coupled with the first delay tap of the next component, and so on for other components until the last one is reached. The total delay of the programmable delay element is determined by programming bits which correspond to the data select inputs of the signal selection circuits. The number of programming bits and the size of the selection circuits may be at a minimum in this embodiment. To achieve greater flexibility in the delay values available from the smaller programmable delay element, some of the delay stages differ in the amount of delay. For example, the delay for one delay stage of a component is different from the delay for a delay stage of one or all of the other components.

In one embodiment, each component has only one delay stage. In one aspect of this embodiment, the delay for the delay stage of each component is different than the delay for the delay stage of any other component. The amounts of the delays of the components may differ by powers of 2.

The delay element may also have a delay sub-element between the output of the signal selection circuit of a component and the first delay tap of a successive component. The delay sub-elements in or outside of a stage may be, for example, inverters or buffers. The amount of delay of a stage may be variable, set, or calibrated to any particular value. According to an aspect of the embodiment with a variable delay stage, a sub-element of that delay stage is a current-starved inverter or a buffer with a high capacitive load.

Within a delay stage, there may be a gating element that is capable of suppressing an operation of at least one of the delay stages. The gating element may occur immediately after one of the delay taps, or it may occur in other places within a stage. In one embodiment, the gating element is a NAND gate.

In another exemplary embodiment of the present invention, an integrated circuit having multiple signal paths that share a delay element is provided. Each signal path has a different source, and each signal path has a different destination. The source of each signal path feeds into an input of a first signal selection circuit, which has an output selectively coupled with its inputs based on one or more data select input signals. The output of the first signal selection circuit travels to an input of a delay element, which has an output coupled with the destination of each signal path. In one embodiment, the delay element is programmable.

The source of one signal path may be the same as the destination of another signal path. In one embodiment, the signal paths are input and/or output signal paths. Specifically, one of the signal paths may be an input signal path and another is an output signal path.

The integrated circuit may also have output signal selection circuits with a first input coupled to the source of a respective signal path and a second input coupled with the output of the delay element. The output of an output signal selection circuit is coupled with the destination of that signal path. When one signal path is active and being delayed with the delay element, the output signal selection circuit of a second signal path may be adapted to select the input coupled with the source of the second signal path. When only one of the signal paths is active at one time and all signals are to be delayed, the first signal selection circuit is adapted to select the currently active signal path to be delayed by the delay element; and the output signal selection circuit of the active signal path selects to output the delayed signal to the destination of that active signal path.

The integrated circuit may also have one or more additional delay elements, which have an output coupled with at least one output selection circuit, and the circuit may also have input signal selection circuits. The input signal selection circuits have an output coupled with an input of one additional delay element, a first input coupled with the source of at least one of the signal paths, and a second input coupled with the output of at least one of the additional delay elements. In one embodiment, each delay element is coupled to only one output signal selection circuit. In another embodiment, each source is coupled with only one input signal selection circuit. In yet another embodiment, each delay element is coupled to only one input signal selection circuit.

A better understanding of the nature and advantages of the present invention may be gained with reference to the following detailed description and the accompanying drawings.

DESCRIPTION OF EXEMPLARY EMBODIMENTS

Embodiments of the present invention are directed to delay elements that require less area and use less power than standard delay elements. The delay elements may be used, for example, to slow down data or clock signals on an integrated circuit. In some embodiments, the delay elements are programmable. The integrated circuit may be, for example, a programmable logic device (PLD), such as field programmable gate arrays (FPGA), or non-programmable devices, such as an application specific integrated circuit (ASIC). The integrated circuit may utilize different materials or devices to implement the delay elements, such as typical semiconductor technology, as well as carbon nanotubes or silicon nanowires.

Figure 1:
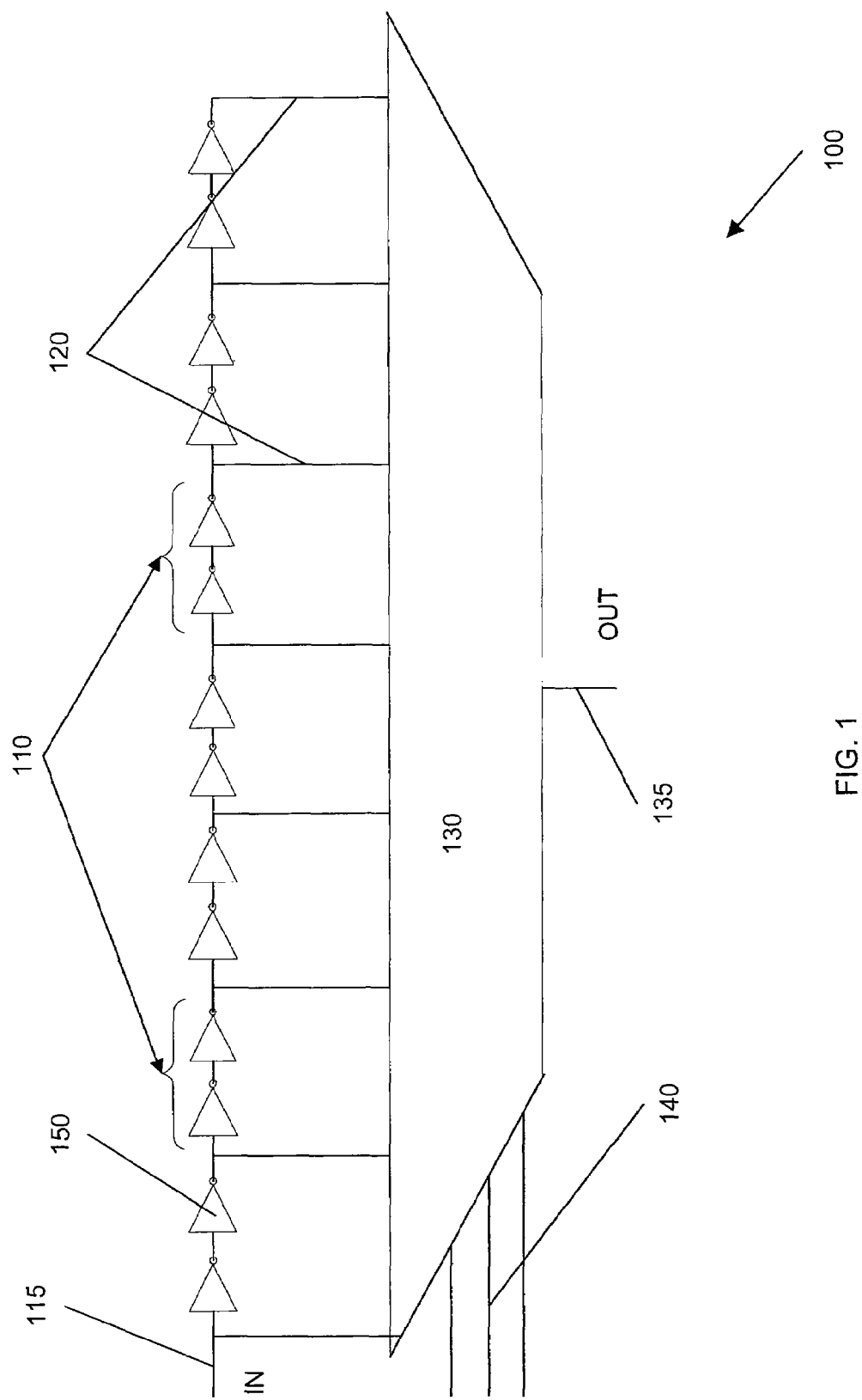
FIG. 1 is a schematic of a delay element that is improved by incorporating an embodiment of the present invention.

FIG. 1 shows a typical implementation of a delay element 100 that is improved by incorporating an embodiment of the present invention. Each stage 110 of delay element 100 adds more delay to the incoming signal on line 115. In FIG. 1, simple inverters 150 are used as delay sub-element in each of the delay element stages 110. The propagation delay through the simple inverters is used to achieve the delay at each stage.

In order to provide multiple delay increments, delay taps 120 are inserted before and after the stages 110. Delay taps 120 are then coupled with inputs of multiplexer 130, which selects the desired delay increment. This selection may be achieved using programming bits 140. In FIG. 1, the programming bits 140 are made of a three-bit number that selects one of the eight inputs for output. The signal on the selected delay tap, which corresponds to the desired delay increment, is output from multiplexer 130 on line 135 as the output of the delay element 100.

When using delay element 100 a signal propagates through all of the stages 110 regardless of which delay tap is chosen for output. To avoid unnecessary power dissipation through programmable delay elements with stages, embodiments of the present invention employ techniques to limit the signal propagation through unnecessary parts of the delay elements.

Figure 2:
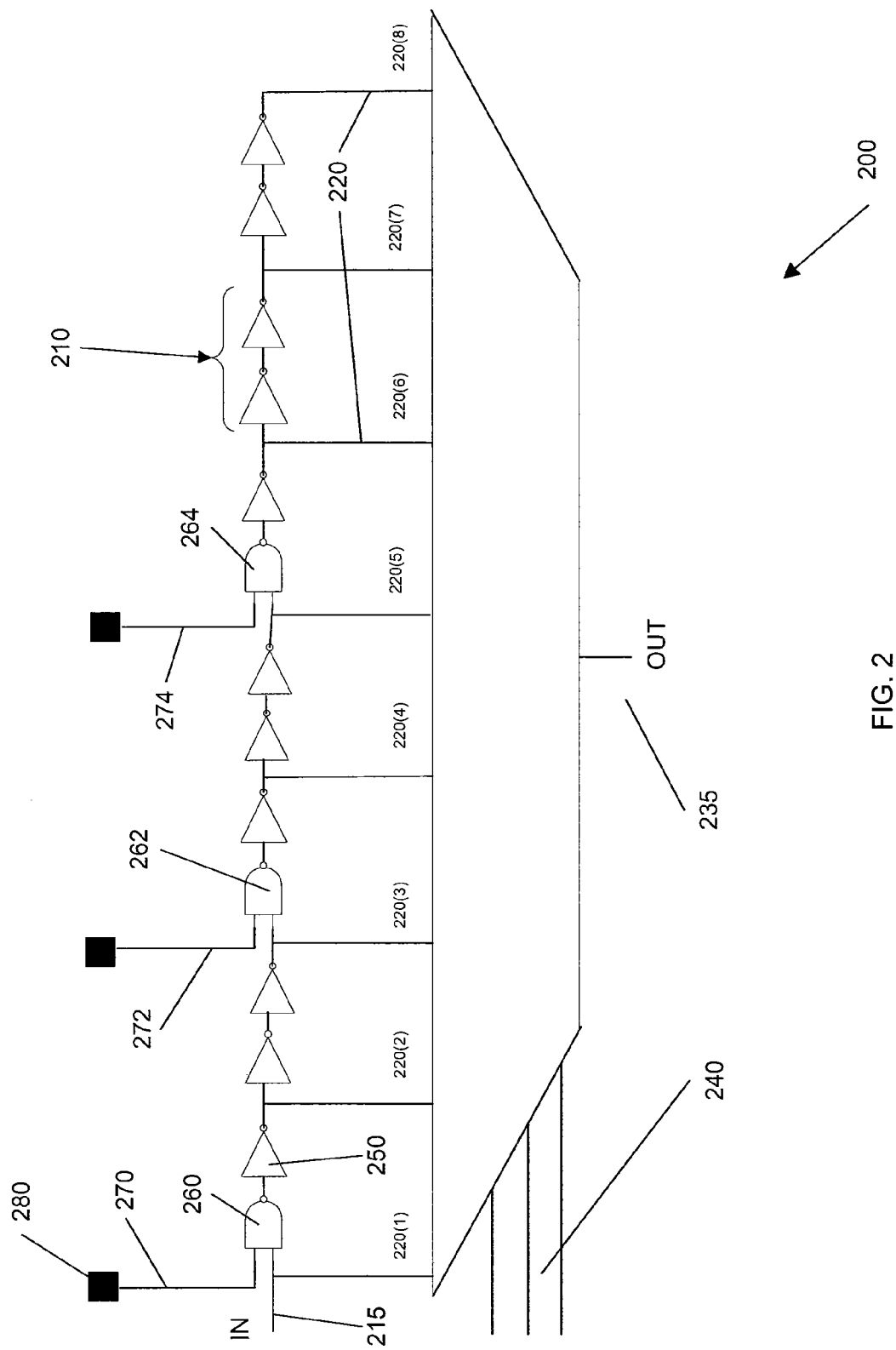
FIG. 2 is a schematic of a power efficient delay element according to an embodiment of the present invention.

FIG. 2 shows an implementation of a delay element 200 according to an embodiment of the present invention. Each stage 210 of delay element 200 adds more delay to the incoming signal on line 215. Delay sub-elements 250 are used in delay element stages 210. In the embodiment of FIG. 2, simple inverters are used as one of the delay sub-elements.

In order to provide multiple delay increments, delay taps 220 are connected before and after the stages 210. Delay taps 220 are then coupled with inputs of a signal selection circuit, such as multiplexer 230, which selects the desired delay increment. This selection may be achieved using programming bits 240. The signal on the selected delay tap is output from multiplexer 230 on line 235 as the output of the delay element 200. Multiplexer 230 can be any general selection circuit composed of, for example, logic gates, tristate gates, pass gates, or pass devices.

To save power, some or all of stages 210 can be shut off using gating elements 260-264. Stages may be "shut off" because every stage after the selected delay tap is unimportant. For example, if no delay is required then the incoming signal does not need to propagate through any of stages 210. If the signal does not propagate, then circuit elements using that signal, such as inverters 250, have their operation suppressed and energy is saved. As depicted, a NAND gate is used for gating element 260, but other gates, such as AND gates, and other circuit elements may be used. Note that gating element 260 is also a delay sub-element and that a stage may have a gating element as the only sub-element.

Whether or not an incoming signal propagates past a gating element may be determined by shut-off configuration signals or bits 270-274. A configuration bit may be stored in a memory element 280 or may be an active signal, possibly derived from logic. The configuration bits 270-274 and the programming bits 260 may be related since stages after the selected delay tap may be shut off, and the incoming signal should propagate at least until the selected delay tap.

In FIG. 2, there are three shut off points, each corresponding to one of gating elements 260-264. For example, gating element 260 may be used to stop or prevent propagation of the incoming signal through any of the stages. If the first tap 220(1) (propagation through no delay stages) is selected, the first shut-off configuration bit 270 can be configured to disable signal propagation through the first and, hence, all subsequent delay stages. This will prevent all delay stages 210 from toggling even as the incoming signal to delay element 200 changes.

If the second tap 220(2) (propagation through one delay stage) is selected, the second shut-off configuration bit 272 can be configured to disable signal propagation through the third and all subsequent delay stages. In this case, the second stage still toggles even though its output is not "listened to"; however, it can not be shutdown because there is no gating element and shut-off configuration bit for this stage.

One skilled in the art will recognize the many different configurations for shut off points that are possible. In some embodiments, each stage may have a gating element. In other embodiments, such as FIG. 2, only select stages have a gating element. Note that there is a tradeoff between other costs and shutdown flexibility.

In other embodiments, delay sub-elements 250 other than simple inverters may be used for each of the stages 210, such as current-starved inverters or buffers with high capacitive loads. The delays of stages 210 may be varied by using such sub-elements. For example, current-starved inverters can be slowed down and sped up using the appropriate control voltage. Also, capacitive loads can be selectively applied by using pass gates to connect the capacitive loads to delay stages 210. Similarly, the stages of a delay element may be calibrated to any value.

Since the delay of individual stages can be controlled, stages may not even be necessary. A single stage with a programmable sub-element for creating delay can be used as a delay element. However, it is common to have delay stages because a single stage can not be made arbitrarily slow without resulting in bad side-effects, such as low noise immunity and large signal transition times which may result in more power dissipation due to short-circuit current.

Figure 3:
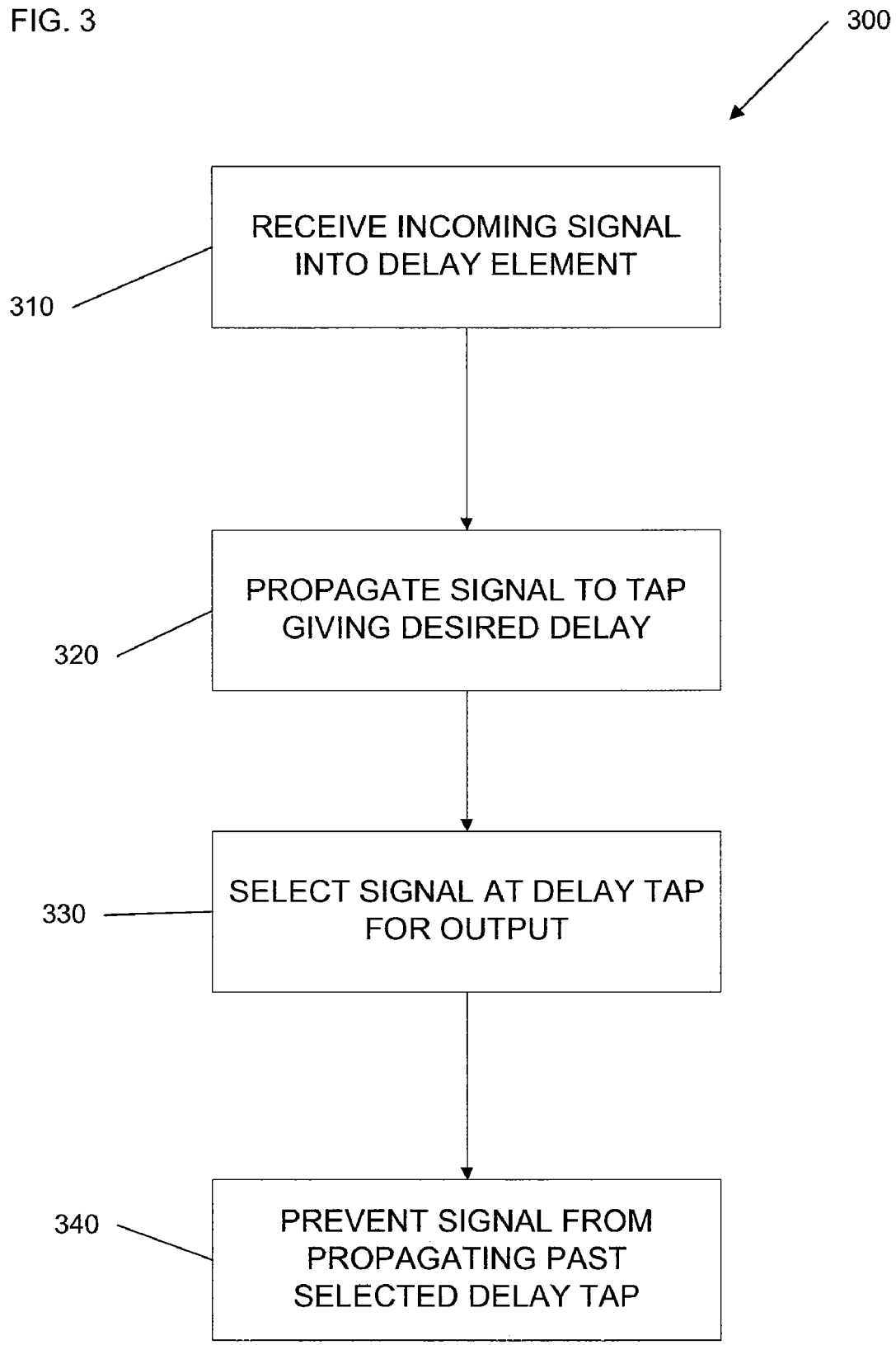
FIG. 3 is a flow chart illustrating a method of shutting off stages of a delay element according to an embodiment of the present invention.

FIG. 3 illustrates a method 300 for suppressing operation of certain parts of a delay element according to an embodiment of the present invention. In step 310, the incoming signal into the delay element is received. In step 320, the signal is propagated through delay stages until the signal reaches the delay tap giving the desired delay. In step 330, the signal at the desired delay tap is selected for output from the delay element. In step 340, the signal is prevented from propagating past the selected delay tap.

Besides unnecessarily using energy, delay element 100 can also be quite large. In order to have many choices for delay increments, multiplexer 130 is often quite wide, and thus takes up significant area on an integrated circuit. To save area, embodiments of the present invention employ more efficient selection processes and circuits.

The area requirements for delay elements, particularly different configurations for multiplexer 130 or other selection circuit, are first described. FIGS. 1 and 2 show an encoded programming state for multiplexer 130, where the number of programming bits grows logarithmically with the number of delay taps. In other embodiments, the number of programming bits may grow linearly with the number of delay taps, giving a fully decoded programming state. Other embodiments may use a mixture of these alternatives to give partially decoded programming states.

Figure 4:
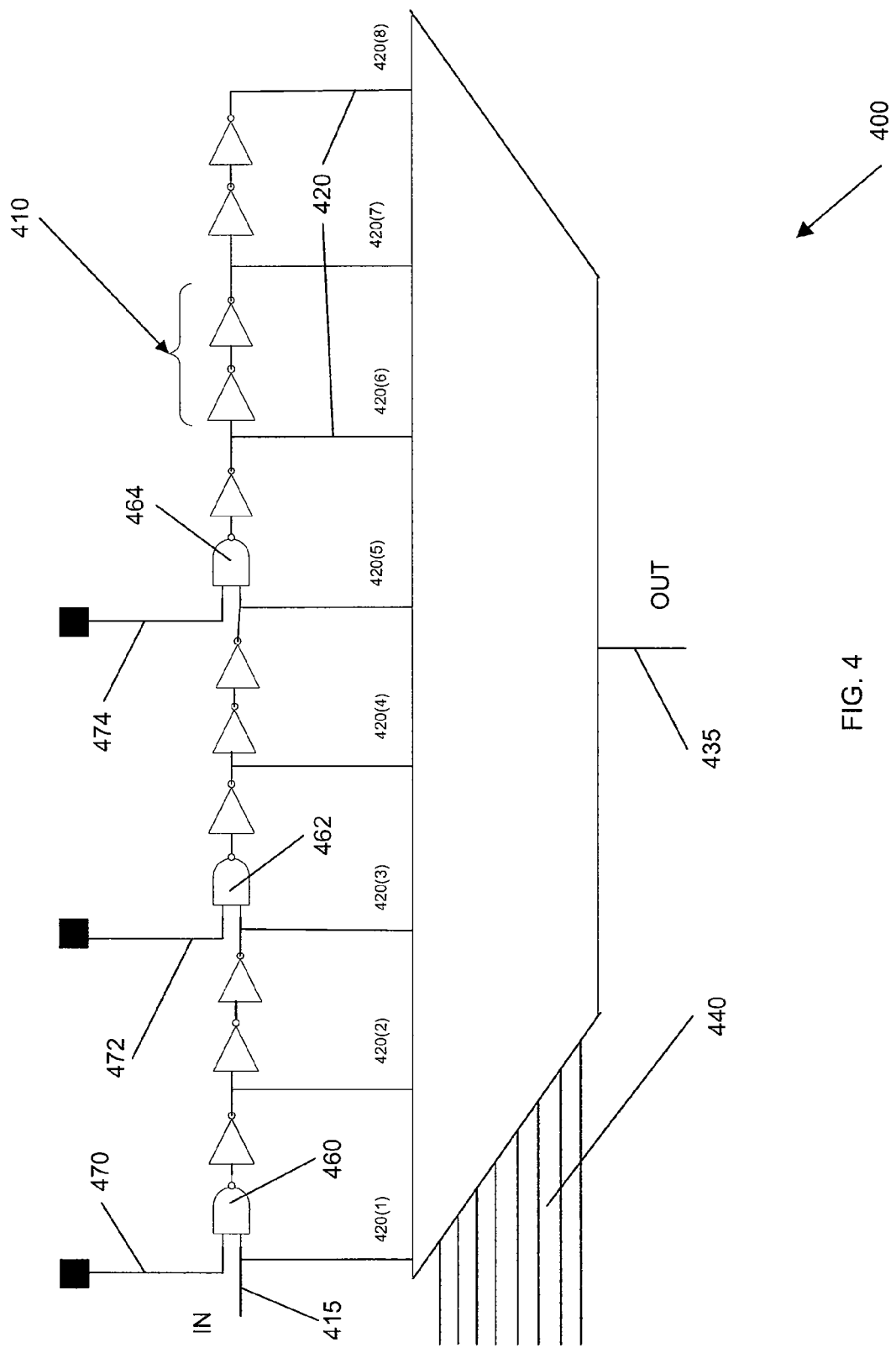
FIG. 4 is a schematic of a power efficient delay element that is fully decoded according to an embodiment of the present invention.

FIG. 4 shows a delay element 400 having a fully decoded multiplexer according to an embodiment of the present invention. In a fully decoded programming state, the configuration signals 470-474 may be equivalent to certain ones of the programming bits 440. For example, when the first delay tap is chosen then the first programming bit is "on", and correspondingly the configuration signal 470 is "on" to prevent propagation of a signal to later stages of the delay element 400. Thus, the first programming bit and the first configuration bit are equivalent and can track each other by always being exactly the same value or always the opposites of each other.

Accordingly, a corresponding programming bit and configuration signal may be derived from the same memory element or signal. The programming bit to which a configuration signal corresponds is determined by which delay tap occurs before the gating element that the configuration signal is associated. For example, configuration signal 472 corresponds to the third programming bit, which chooses whether or not to send the signal on the delay tap 420(3) for output.

Figure 5:
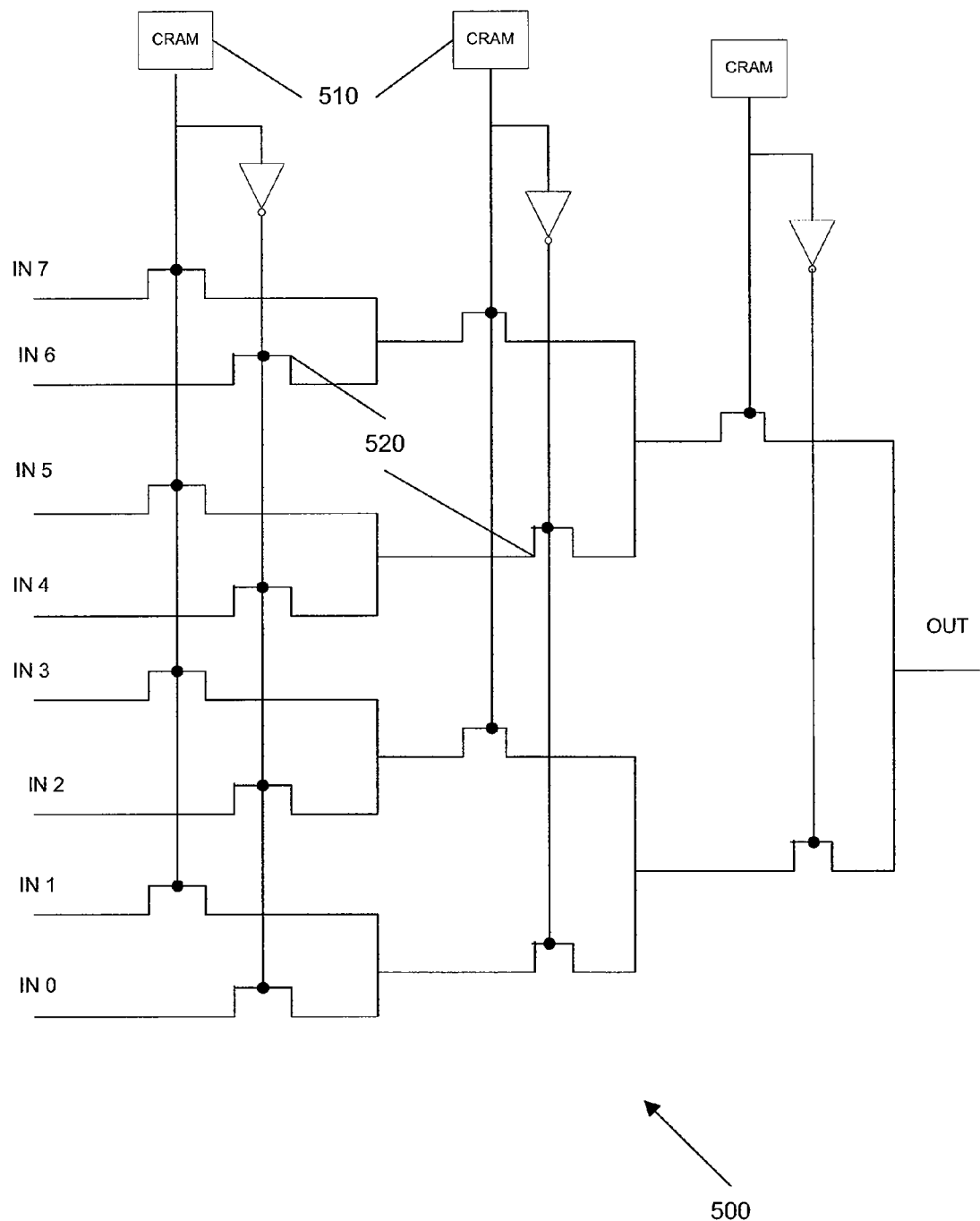
FIG. 5 is a schematic of a fully encoded multiplexer usable in an embodiment of the present invention.

FIG. 5 shows a schematic of a multiplexer 500 with eight inputs in a fully encoded programming state. The number of programming bits 510 stored, e.g. in CRAM, is at a minimum since there is logarithmic growth with the number of delay element stages. In particular, the number of programming bits is LOG 2(N), where N is the number of inputs (delay taps). The word "encoded" refers to the state space associated with the programming bits of multiplexer 500. All programming bit settings are "meaningful" for an encoded state when the size of the multiplexer is a power of 2.

The size of multiplexer 500 grows linearly with N, which is not as optimal as logarithmic growth. The number of transmission gates (or pass transistors) 520 is equal to, approximately, 2N−2. The total area cost will be a function of the relative sizes of programming bits 510 and transmission gates 520.

Figure 6:
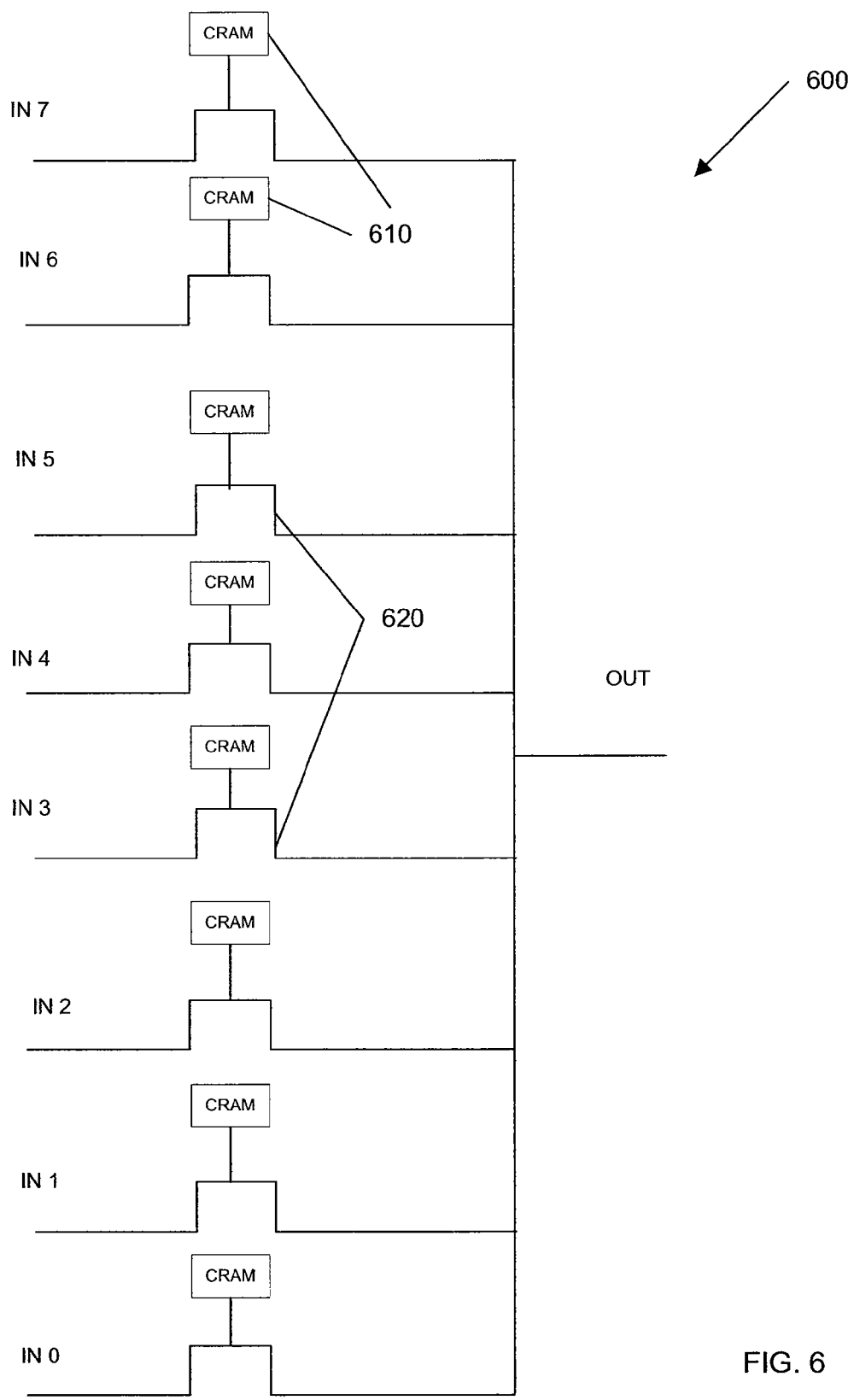
FIG. 6 is a schematic of a fully decoded multiplexer usable in an embodiment of the present invention.

FIG. 6 shows a schematic of a multiplexer 600 with eight inputs in a fully decoded programming state. The number of programming bits 610 grows linearly with the number of delay element stages. In particular, the number of programming bits is N. The size of multiplexer 600 also grows linearly as it has N transmission gates (or pass transistors) 620, where each transmission gate is controlled by a programming bit 610. Notice that some configuration bit settings are illegal (all legal settings have one bit set to 1, and all others set to 0). Again, the total area cost will be a function of the sizes of the programming bits and the transmission gates.

Typically, a fully decoded multiplexer is faster than a fully encoded one. However, a fully decoded multiplexer requires more programming bits than a fully encoded multiplexer.

As mentioned earlier, a mixture of these extreme alternatives is also possible; many hybrids of the above two programming states are possible. It is also possible to reduce the number of memory elements for a given transmission gate structure if decoding logic is used to provide the necessary "decoded" control signals for the transmission gates. The decoding logic takes the encoded state space and generates signals (programming bits) to support a partially, or fully, decoded state.

Given that the total area cost is a function of the sizes of the programming bits and the transmission gates, it is desirable to have both increase logarithmically with the number of delay increments (stages) that are available. To save area, it is important to realize that the delay added to a signal is a function of the number of stages the signal is made to propagate through, and not the fact that it propagates through those stages in a particular sequence. Consequently, delay can be added in a more area efficient manner by dividing the staged delay element up into components, with each component containing a different number of stages.

Figure 7A:
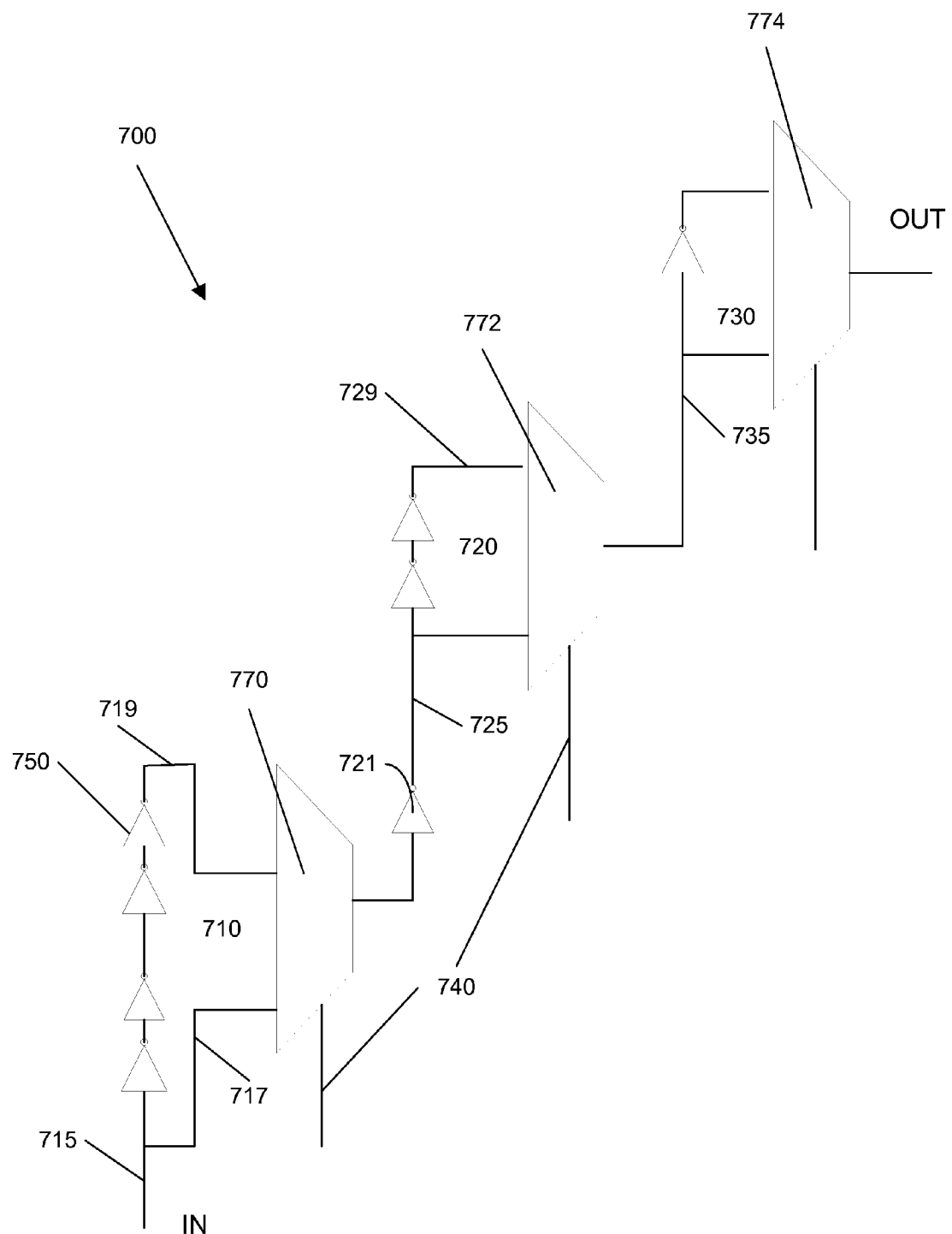
FIG. 7A is a schematic of an area efficient delay element according to an embodiment of the present invention.

FIG. 7A shows a delay element 700 according to an embodiment of the present invention. Delay element 700 has three components 710-730. Each component can produce two different output signals: one that is delayed by an amount defined by delay sub-elements and one that is non-delayed. The output of components 710 and 720 feed the non-delayed input of components 720 and 730 respectively. As each component delays the incoming signal into that component by an amount different than any of the other components, the total number of possible delay increments for delay element 700 is eight.

Specifically, component 710 includes four buffers 750 and a multiplexer 770 that has two inputs. An incoming signal enters the delay element 700, and component 710, on line 715. A non-delayed signal is sent to multiplexer 770 through delay tap 717. A signal delayed by four increments (buffers 750) is sent to multiplexer 770 through delay tap 719.

The output from component 710 feeds into component 720 through line 725, which is coupled with the non-delayed input for multiplexer 772. Component 720 includes two buffers. A signal delayed by two increments is sent to multiplexer 772 through delay tap 729. The output from component 720 feeds into component 730 through line 735. Component 73 includes one buffer and thus may delay a signal by one increment. In some embodiments, a delay sub-element 721 may occur on line 725 before the first delay tap for component 720, similarly for component 730. This extra delay sub-element adds an offset to delay element 700, such that the minimum delay is no longer zero, but the number of delay sub-elements added.

Although each of the multiplexers has two inputs (delay taps), the total number of possible delays is eight. For example, for no delay, each multiplexer chooses the first (non-delayed) input. For one increment of delay (one buffer), the multiplexers of components 710 and 720 choose the first input while the multiplexer of component 730 chooses the second input. For five increments of delay, the four-increment delay signal from component 710 is chosen on the second input of multiplexer 770; the non-delayed (zero-increment) signal is chosen from component 720; and the one-increment delayed signal is chosen from component 730 to give a total delay of five increments. Since each multiplexer has two options and each has a different amount of delay, the total number of different delay increments is $2^K$ where K is the number of components.

Delay element 700 uses a minimum number of programming bits 740 (LOG 2(N)), where N is the number of different delay increments available. Also, the number of transmission gates (or pass transistors) now grows logarithmically as well (2×LOG 2(N)). This is because each multiplexer has two transmission gates because each multiplexer only has two inputs, and the number of multiplexers is equal to the number of programming bits. Accordingly, for a large delay element, the area dominant part will be the delay sub-elements 750 in the delay element, and not the signal selection circuitry.

Also, the stages can be made area efficient through the orthogonal techniques discussed earlier, e.g. using current starved inverters. There is more opportunity to do this now because not every stage is listened to. For example, the four buffers 750 of component 710 can be replaced with a single area-efficient sub-element with four times the delay of a single buffer or sub-element.

Figure 7B:
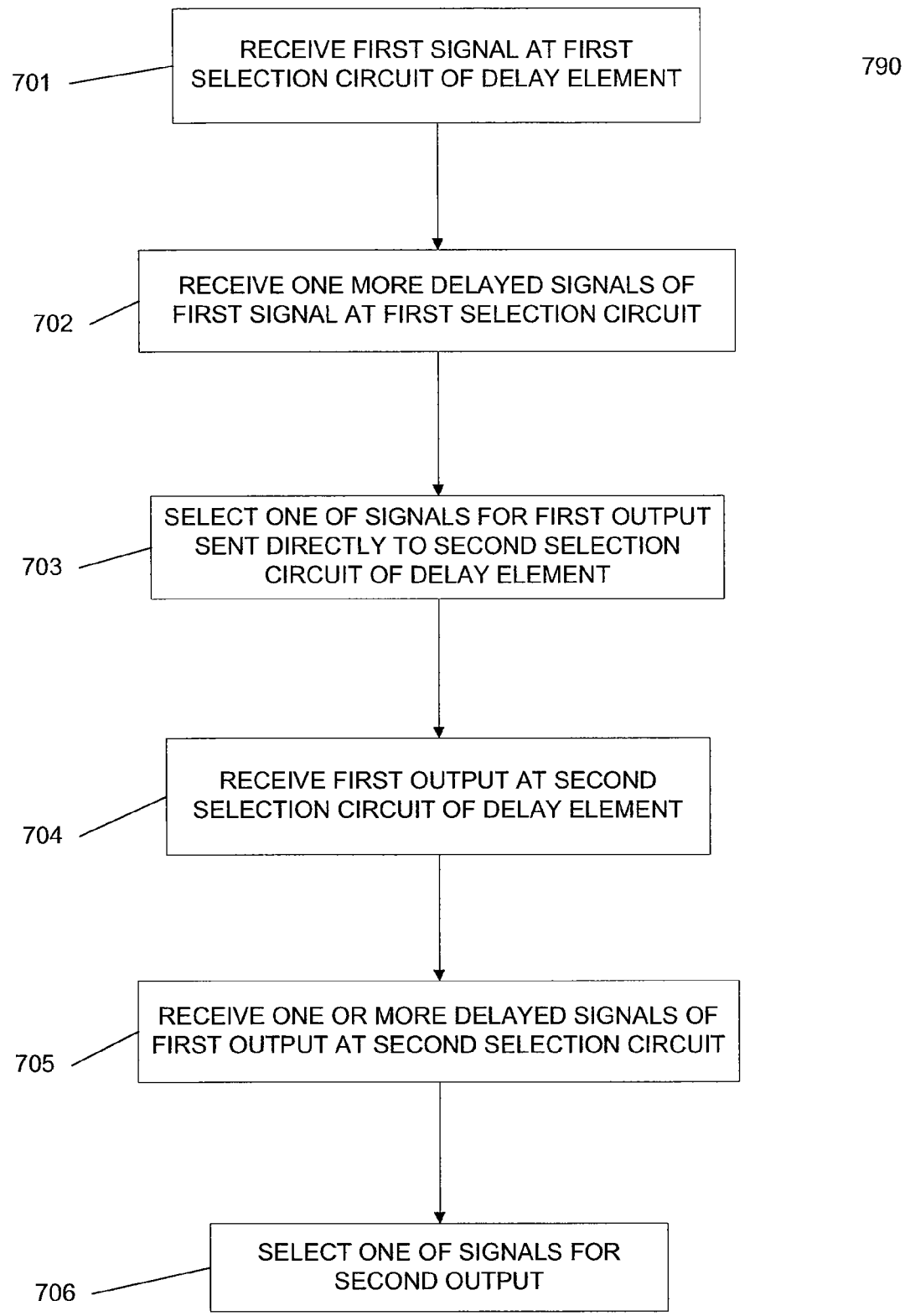
FIG. 7B is a flow chart illustrating a method of delaying a signal within a single delay element using minimal area according to an embodiment of the present invention.

FIG. 7B illustrates a method 790 for delaying signals with a programmable delay element according to an embodiment of the present invention. In step 701, a first signal is received at a first selection circuit of the delay element. In step 702, one more delayed signals of the first signal is received at the first selection circuit. In step 703, one of signals is selected for a first output, which is sent directly to a second selection circuit of the delay element, based on a programming bit of the delay element. In step 704, the first output is received at a second selection circuit. In step 705, one or more delayed signals of the first output is received at the second selection circuit. In step 706, one of signals is selected for a second output based on another programming bit of the delay element.

Because stages are no longer being successively cascaded to add more delay, non-monotonic delay increases can result. For example, a lower setting (value of programming bits) can result in a delay which is greater than a subsequent setting, which is opposite to what is expected. This happens because completely separate stages may be used by a subsequent setting. However, careful design can mitigate this effect.

Additionally, this behavior can be accommodated so long as the delays generally increase over the delay range. During design, the appropriate order of the settings may be chosen so that a monotonic increase is obtained. For example, a CAD tool can easily select the appropriate setting by consulting a table that indicates the delay corresponding to each setting.

The amount of delay, which corresponds to the number of sub-elements for the embodiment of FIG. 7A, for each component may vary. The number of sub-elements for successive components may be increasing, decreasing, fluctuate, or even some successive stages, but not all, may stay the same. For instance, FIG. 7A shows successive components with 4, 2, and 1 sub-elements respectively. Other embodiments may have successive components with 1, 2, and 4 sub-elements respectively, and successive components with 2, 1, and 4 sub-elements respectively. An embodiment may even have successive components with 2, 2, and 1 sub-elements although some functionality would be lost. That is the total number of delay increments available would be less than $2^K$. One skilled in the art will recognize the many different combinations. A four component delay element could have successive components with 2, 2, 1, and 1 sub-elements.

In other embodiments, the number of delay taps may be increased. For example, a component may have 3 delay taps, with one being between two stages. If the three components of FIG. 7A each have three delay taps (two stages), then the total number of different delays could be as high as $3^3=27$. For example, if both stages of component 710 each have one unit of delay, both stages of component 720 each have three units of delay, and both stages of component 735 each have nine units of delay, then delays between 0 and 26 can be achieved. In one aspect, the factor increase of delay of successive components depends upon the number of stages of the components. In other embodiments, the stages of a single component may have different amounts of delays; however, consecutive values of different delays will not be achieved. However, if the number of delay taps is increased, a component (multiplexer) will need more than one programming bit, and the size of each component (multiplexer) will grow larger. The number of delay taps may also vary among each component, and the selection circuits may also be fully decoded, fully encoded, or a mixture thereof.

This area-saving technique can be combined with the power-saving technique described previously. If a component is not used, then it may be shut down by preventing the incoming signal from traveling through the component's sub-elements and toggling such sub-elements. This may be accomplished by replacing the first buffer with a gating element, such as an AND gate or a NAND gate followed by an inverter.

Another way to save area in a PLD or other integrated circuit is to reduce the number of distinct delay elements by recognizing that multiple signal paths can use the same delay element. To understand this better, consider, as an example, a typical input and output (I/O) cell, where the input signal path has its own delay element and the output signal path has its own delay element, as shown in FIG. 8.

Figure 8:
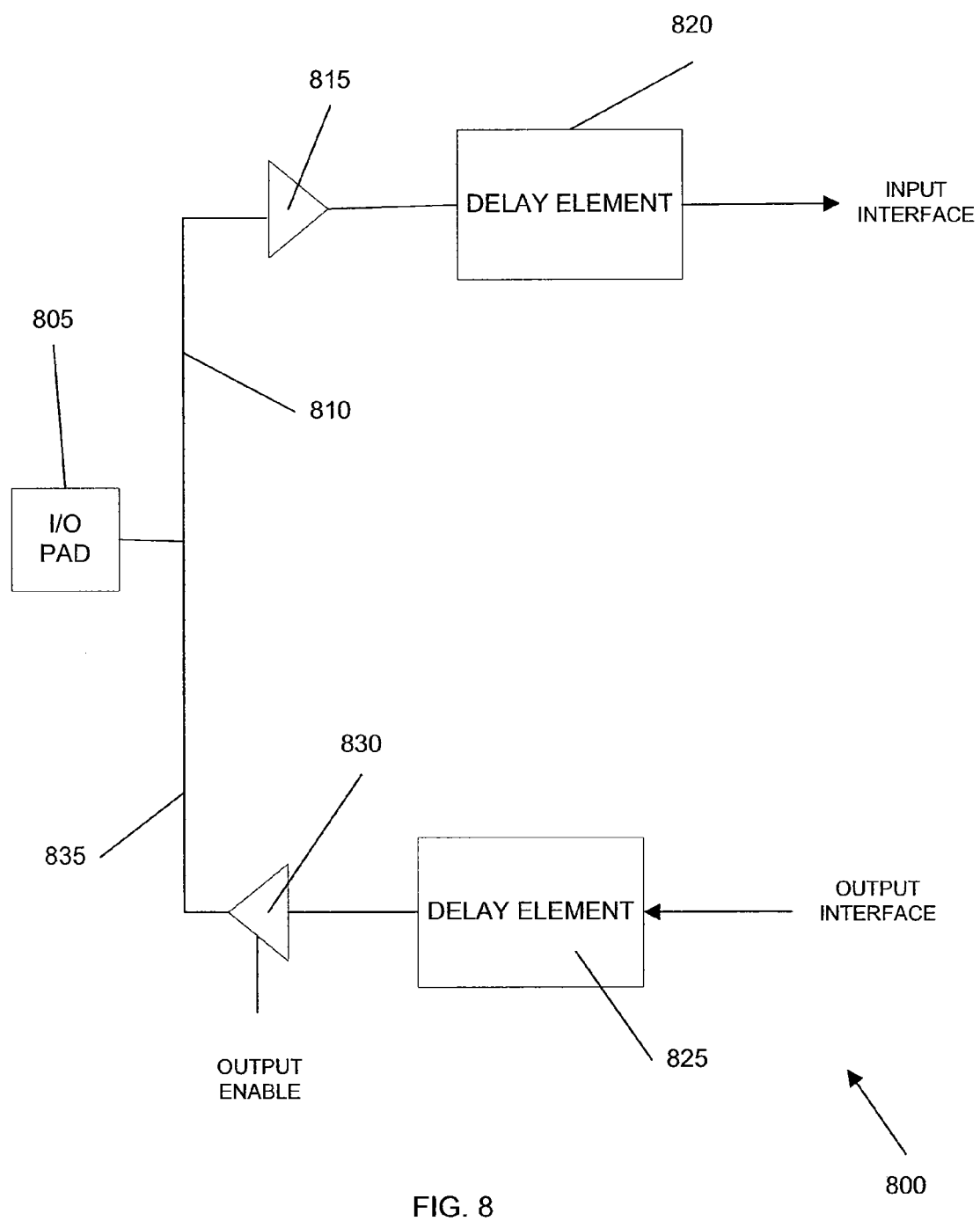
FIG. 8 is a schematic of an I/O cell using two delay elements that is improved by incorporating an embodiment of the present invention.

FIG. 8 illustrates a single standard I/O cell 800 that is improved by incorporating an embodiment of the present invention. An input signal travels from pad 805 on line 810 to input buffer 815. The input signal then travels to delay element 820 and out to the input interface. An output signal comes from the output interface to delay element 825. From delay element 825, the output signal goes to output buffer 830. When the output enable signal on output buffer 830 has a proper value, the output signal travels along line 835 to I/O pad 805.

Having two separate delay elements, one for each signal path, can be wasteful if they are not used at the same time. For example, if an I/O cell can only be configured as an input cell or as an output cell, then only one of the signal paths will be active at a time. Accordingly, the same delay element can be shared by both paths, as depicted in FIG. 9A.

Figure 9A:
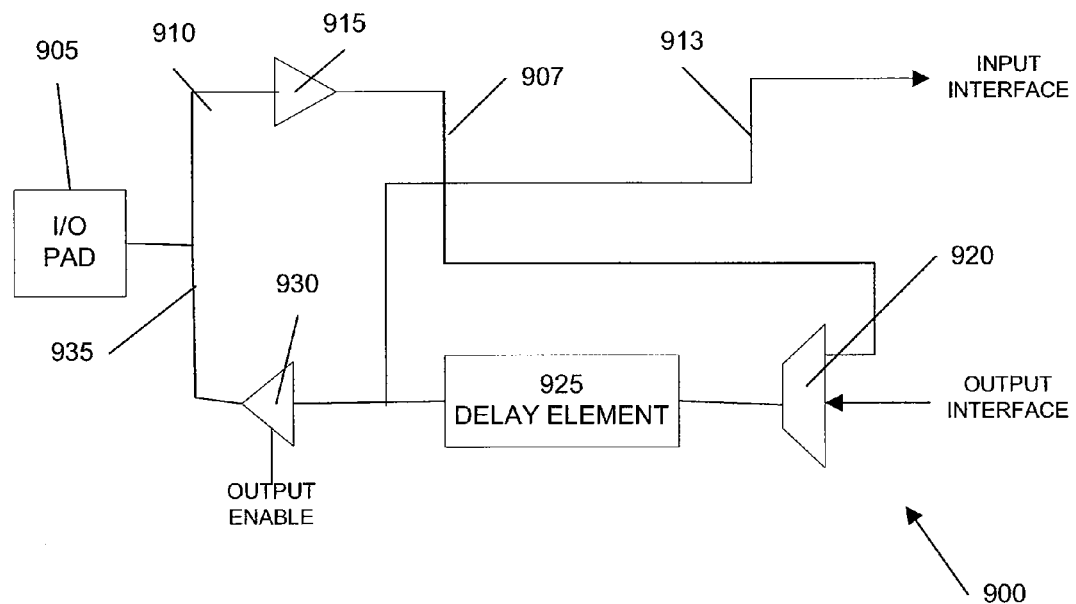
FIGS. 9A and 9B are schematics of I/O cells with an input signal path and an output signal path that share a delay element according to an embodiment of the present invention.

FIG. 9A illustrates an I/O cell 900 according to an embodiment of the present invention. An input signal travels from I/O pad 905 on line 910 to input buffer 915. The input signal then travels to selection circuit 920. Then, if that signal is selected, the input signal travels to delay element 925 and out line 913 to the input interface. For this input signal path, I/O pad 905 is the source of the input signal path, and the input interface is a destination of the input signal path.

In I/O cell 900, an output signal comes from the output interface to selection circuit 920. If that signal is chosen, the output signal travels to delay element 925. From delay element 925, the output signal goes to output buffer 930. When the output enable signal of output buffer 930 has a proper value, the output signal travels along line 935 to I/O pad 905. For this output signal path, the output interface is the source of the output signal path, and I/O pad 905 is a destination of the output signal path.

In this manner, only one delay element is required for the I/O cell 900. This embodiment is supported if only one of the signal paths is active at a time. A signal path is active when signals from the input of the path reach the output. Since only one signal can reach its destination at a time, both signal paths cannot be active at the same time.

Figure 9B:
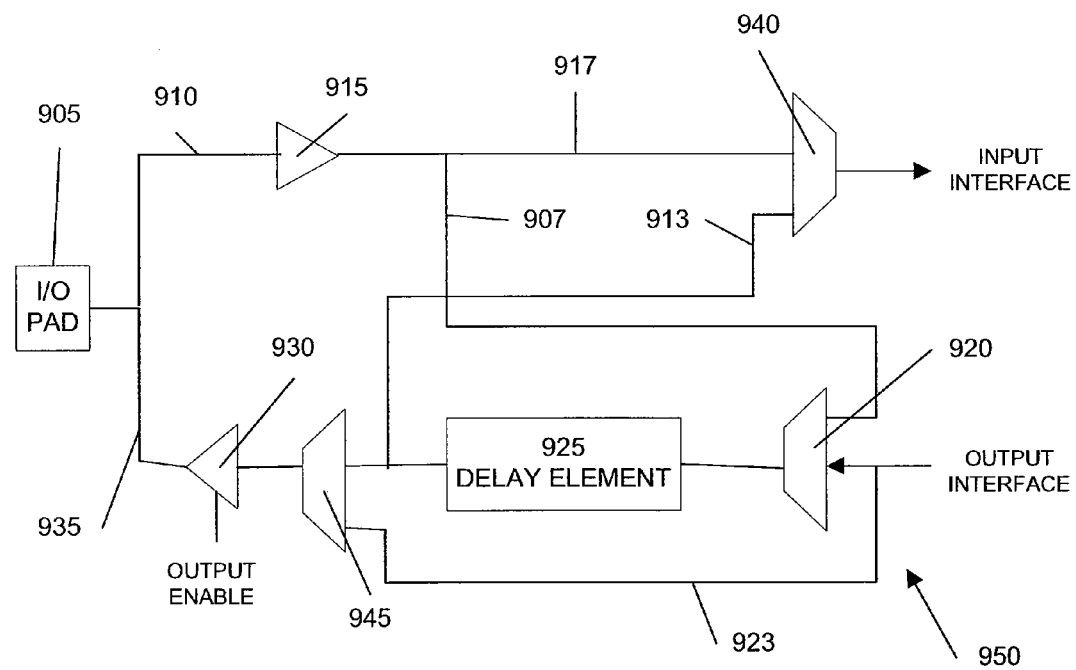

To support bi-directional I/O configurations, where both the input path and the output path may be active, the scheme depicted in FIG. 9B can be used. In this scheme, when both signal paths are active, only one of the two paths can support a programmable delay; however, both the input path and the output path can be active.

FIG. 9B illustrates an I/O cell 950 according to an embodiment of the present invention. To delay an input signal, an input signal travels from I/O pad 905 on line 910 to input buffer 915. The input signal then travels to selection circuit 920. If that signal is selected, then the input signal travels to delay element 925 and out line 913 to selection circuit 94, which may select this delayed input signal to send to the input interface.

I/O cell also allows sending an input signal to the input interface without having going through delay element 925. An input signal also travels directly from input buffer 915 to selection circuit 940, where this signal may be chosen to be sent to the input interface. Thus, if an output signal is active and using delay element 925, an input signal from I/O pad 905 may still be sent to the input interface.

An output signal comes from the output interface to selection circuit 920. If that signal is chosen, the output signal travels to delay element 925. From delay element 925, the output signal goes to selection circuit 945. If that signal is chosen, the delayed output signal goes to output buffer 930. When the output enable signal of output buffer 930 has a proper value, the delayed output signal travels along line 935 to I/O pad 905. In order to send a non-delayed output signal to I/O pad 905, an output signal from the output interface also travels directly to selection circuit 945. Thus, if an input signal is active and using delay element 925, an output signal may still be sent to I/O pad 905.

If the user is given control over the programmable multiplexers (selection circuits) that steer the input and output signals, it is also possible to delay both the input path and the output path when each is active, as long as both are not active simultaneously. For example, the output enable signal could be used to switch which path the delay element "listens to". That way, the output path is delayed when it is being used, and the input path is delayed when it is being listened to. However, the switch-over and settling time of the delay element re-configuration may have to be considered when switching from one mode to the other. If different input and output delays are needed, two sets of programming bits can be used to construct the two different delay element configurations; and circuitry can be used to steer the appropriate programming bits.

Figure 9C:
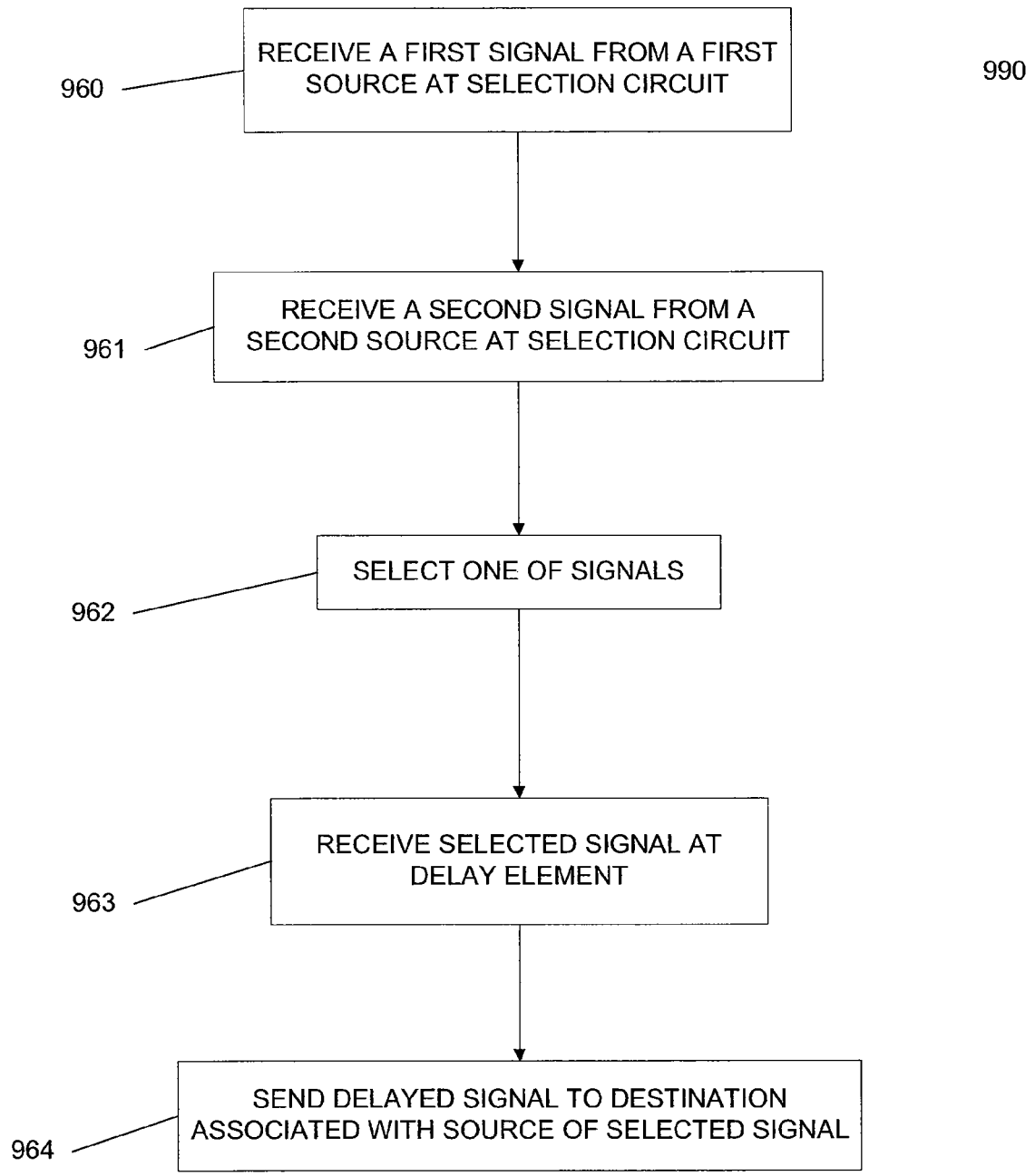
FIG. 9C is a flow chart illustrating a method of sharing a delay element between multiple signal paths according to an embodiment of the present invention.

FIG. 9C illustrates a method 990 for using a sharing a delay element between multiple signal paths according to an embodiment of the present invention. In step 960, a first signal from a first source at selection circuit is received. In step 961, a second signal from a second source at selection circuit is received. In step 962, one of signals is selected. In step 963, the selected signal is received at delay element. In step 964, the delayed signal is sent to destination associated with source of selected signal.

Although an I/O cell was used as an example, other embodiments having multiple paths besides input and output signal paths may be used. For example, a single delay element may be shared between multiple logic element outputs when reaching the routing fabric, or between multiple routing elements. Also, a single delay element may be shared between multiple clock sources when reaching clock networks, or between branches of different clock networks.

Figure 10:
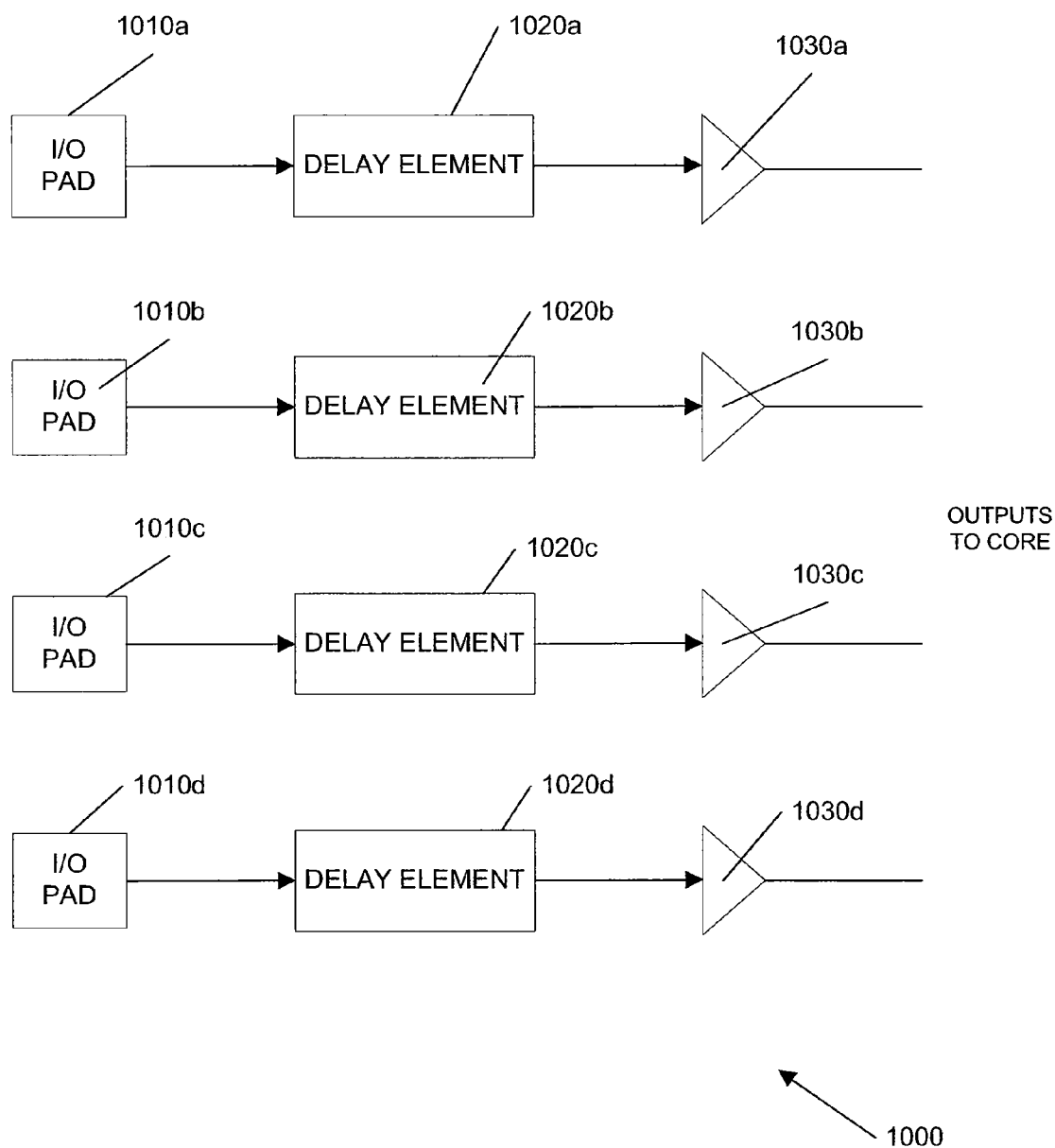
FIG. 10 is a schematic of four input cells using four delay elements that is improved by incorporating an embodiment of the present invention.

FIG. 10 shows a schematic 1000 of four distinct I/O cells that is improved by incorporating an embodiment of the present invention. For clarity, only the input paths of the I/O cells are shown. For each respective input cell, an input signal comes in on I/O pad 1010*a-d*. Each input signal is respectively delayed through delay elements 1020*a-d*, and then sent to buffers 1030*a-d* before going to core logic.

If a longer delay for an input signal path is desired, a circuit has to have more delay elements, or have a larger delay element. For example, for a circuit to have the flexibility of having four times the current delay for each signal path, the circuit may have quadruple the number of delay elements.

Figure 11:
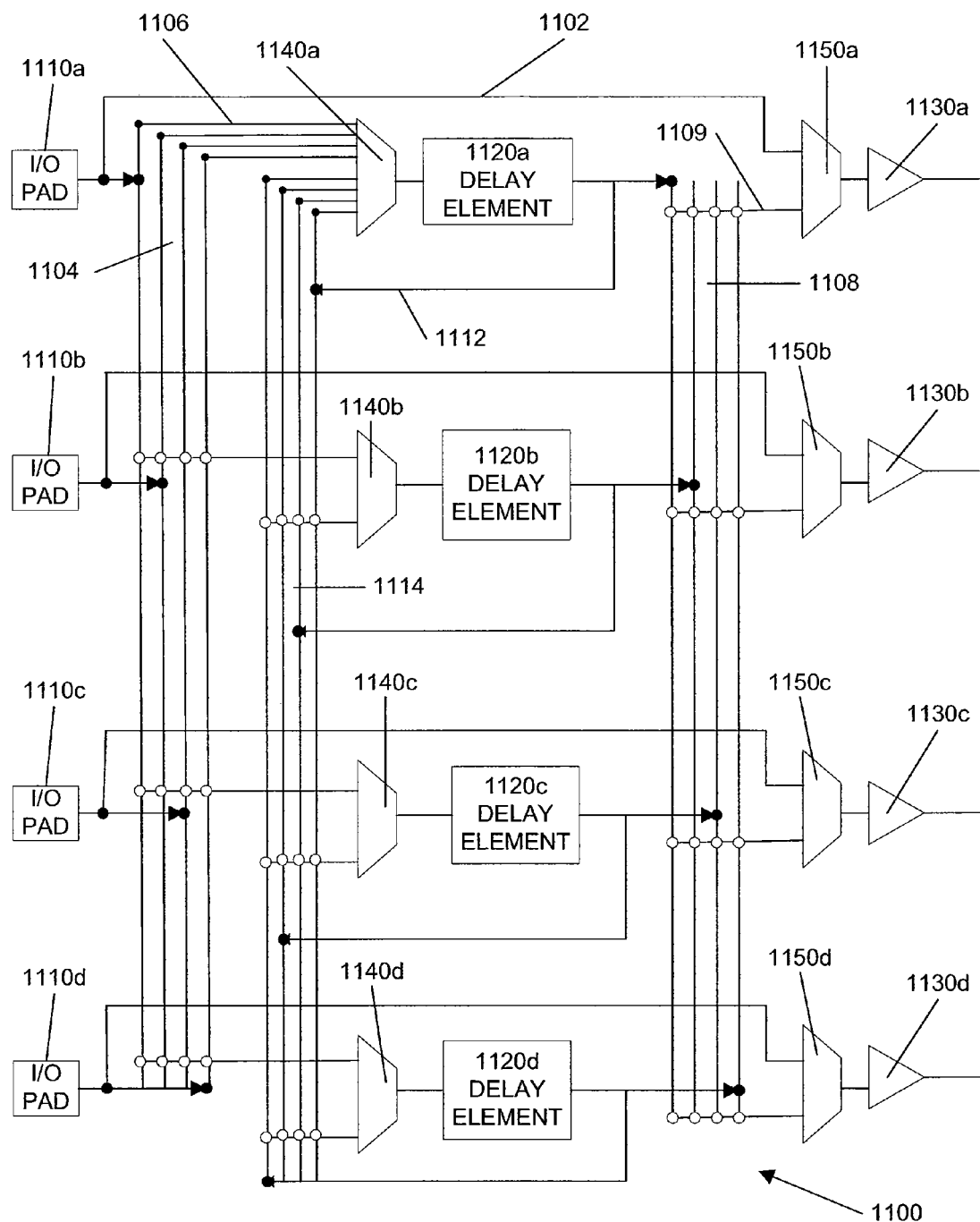
FIG. 11 is a schematic of four input cells sharing four delay elements with a generic feedback pattern according to an embodiment of the present invention.

FIG. 11 shows a schematic 1100 of four distinct I/O cells with generic sharing of delay elements between different I/O input paths according to an embodiment of the present invention. For clarity, only the input paths of the cells are shown. Each input cell has a total of 4 delay elements available to each. No particular I/O signal path is tied to any particular delay element though, so that an input signal from I/O pad 1110*d* can use three of the delay elements and an input signal from I/O pad 1110*c* can use the other delay elements as long there are no active signals from I/O pads 1110*a* and 1110*b*.

As an illustration of a mode of operation, an input signal from pad 1110*a* travels along line 1102 to selection circuit 1150*a*. When no delay is chosen, this non-delayed signal travels to buffer 1130*a* for input to core logic. If a delay is desired, the input signal travels to the one of connector lines 1104. This signal then travels along one of lines 1106 to an input of selection circuit 1140*a*, which may choose this signal to send to delay element 1120*a*. If no further delay is desired, this delayed signal is sent from delay element 1120*a* to one of connector lines 1108.

This first line of connector lines 1108 is selectively connected via line 1109 to selection circuit 1150*a* for sending to core logic. The white connector circles indicate that line 1109 can be adapted to connect to any of the connector lines 1108. This may be done with a hard-wire connection, programmable interconnects, or with multiple lines traveling from each connector line 1108 in the same manner as lines 1106 do for connector lines 1104. There also may be intermediary selection circuits between connector lines 1108 and selection circuits 1150.

If a further delay is desired for the signal coming from delay element 1120*a*, the signal on line 1112, which is coupled with one of connector lines 1114, is utilized. This once-delayed signal may then travel to any of the selection circuits 1140*a-d*, and then if chosen by such circuits to any of the delay elements 1120*a-*1120*d* for further delay. Practically, a delay element will generally only feed the selection circuits of other delay elements. The output of the additional delay elements travel to connector lines 1108 for output to any of the output buffers 1130*a-*1130*d*. The twice-delayed signal may be further delayed in a similar manner.

In this manner, an input signal from any of I/O pads 1110*a-d* may use any number of the delay elements 1120*a*-1120*d*. Thus, if some of I/O pads 1110*a-d* were not being used or whose signals did not require a delay, signals from other pads may be able to utilize these delay elements.

The configurations of the amount of delay assigned for each of the I/O cells of schematic 1100 may be permanently set or configured. If an I/O pad is permanently not to be utilized, connections associated with that signal path may be permanently disconnected. The delay configurations may also be actively changing during operation of the circuit. For example, if a pad is only temporarily not used, then the data select signals to one of the selection circuits may be changed during operation.

Figure 12:
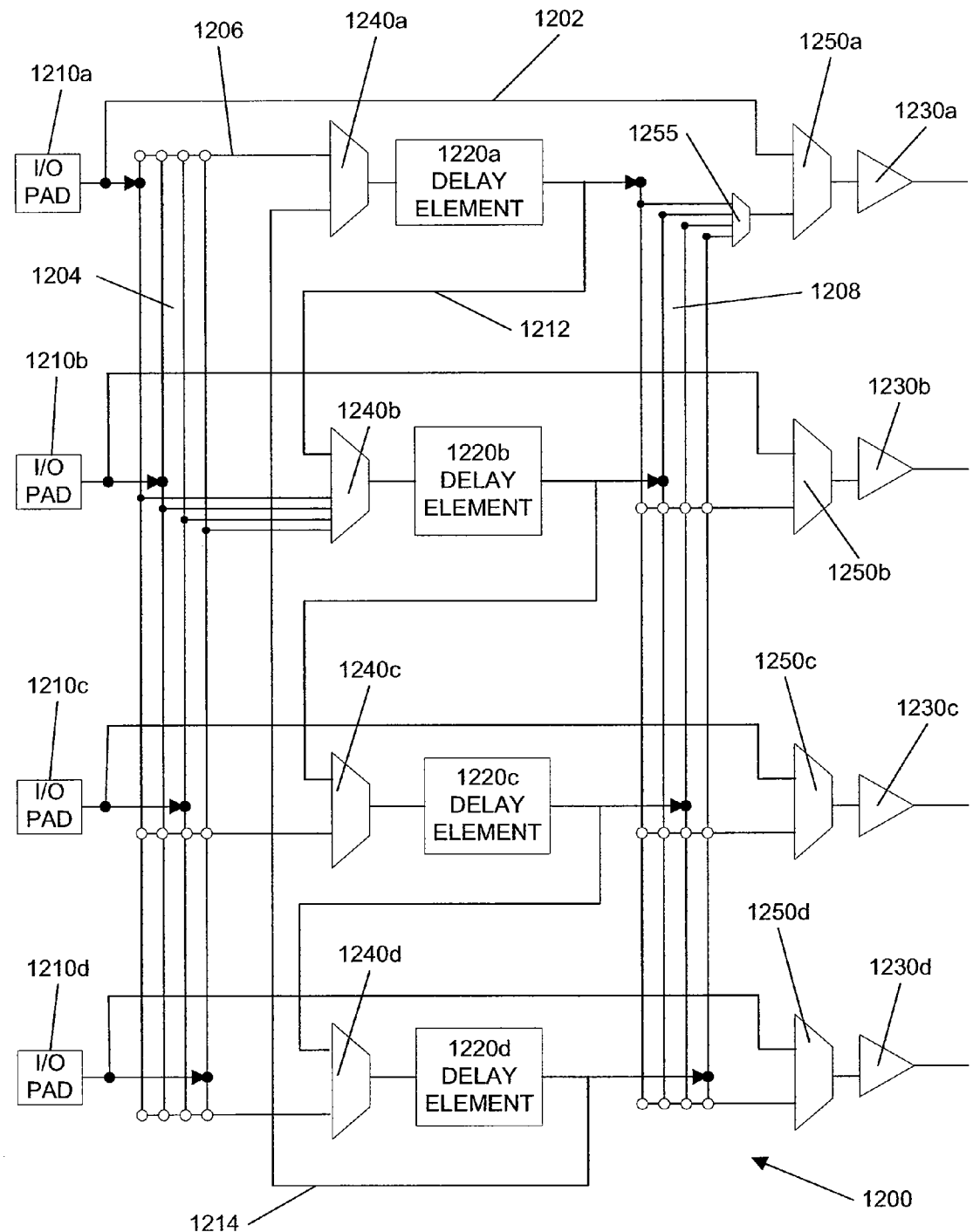
FIG. 12 is a schematic of four input cells sharing four delay elements with a deterministic feedback pattern according to an embodiment of the present invention.

FIG. 12 shows a schematic 1200 of four distinct I/O cells with generic sharing of delay chains with a deterministic feedback pattern. As with schematic 1100, each input cell has a total of 4 delay elements available to each. No particular I/O is tied to any particular delay element though, so that an input signal from I/O pad 1210*d* can use three of the delay chains and an input signal from I/O pad 1210*c* can use the other delay chain as long there are no active signals from I/O pads 1210*a* and 1210*b*.

As an illustration of a mode of operation, an input signal from pad 1210*a* travels along line 1202 to selection circuit 1240*a*. When no delay is chosen, this non-delayed signal travels to buffer 1230*a* for input to core logic. If a delay is desired, the input signal travels to the one of connector lines 1204. This signal then travels along one of lines 1206 to an input of selection circuit 1140*a*, which may choose this signal to send to delay element 1220*a*. If no further delay is desired, this delayed signal is sent to one of connector lines 1208. This one of connector lines 1208 is selectively connected to selection circuit 1250*a* for sending to core logic. In FIG. 12, this is accomplished with another selection circuit 1255, although the connection may be made in many different ways.

If a further delay is desired for the signal coming from delay element 1220*a*, the signal on line 1212 is utilized. This once-delayed signal feeds an input of selection circuit 1240*b*, which chooses among the signal on line 1212 and the signals from connector lines 1204. This process may be repeated so that the input signal on I/O pad 1210*a* may be delayed up to four times.

As the connector lines 1104 receive signals from all of the I/O pads 1210, any of the delays elements 1220 may be used by any of the signals coming from any of the pads. Since the output of delay element 1220*d* feeds an input of selection circuit 1240*a*, an input signal on any of the I/O pads 1210 may be delayed up to four times. Additionally, the total amount of delay for any combination of input signals can be a total of four delay increments. Thus, full flexibility is still obtained.

There are many possible variations on the scheme presented in schematic 1100. In schematic 1100, there are three stages of patterning (input 1104, feedback 1114, and output 1108). To achieve full flexibility, only two need to be general, and the other one can be deterministic. For example, every input pad 1110 feeds only one delay element 1120, or every delay element only feeds one other delay element as in schematic 1200, or every delay elements only feeds one output. With any of these embodiments, full flexibility can still be achieved.

The embodiments of FIGS. 11 and 12 may also be used for output cells, as well as any set of signal paths that tend to not need to be delayed by a large delay all at the same time. It should be noted that in some embodiments the number of delay elements may be smaller than the number of signal paths, while in other embodiments the number may be larger. In addition, embodiments may combine sharing of delay elements between input and output signal paths from the same cell (as in FIGS. 9A and 9B) along with sharing delay elements between multiple input and output signal paths (as in FIGS. 11 and 12). The delay elements may utilize gating elements to minimize energy usage, such as in delay element 200. The delay elements may also implement area efficient techniques, such as in delay element 700.

Figure 13:
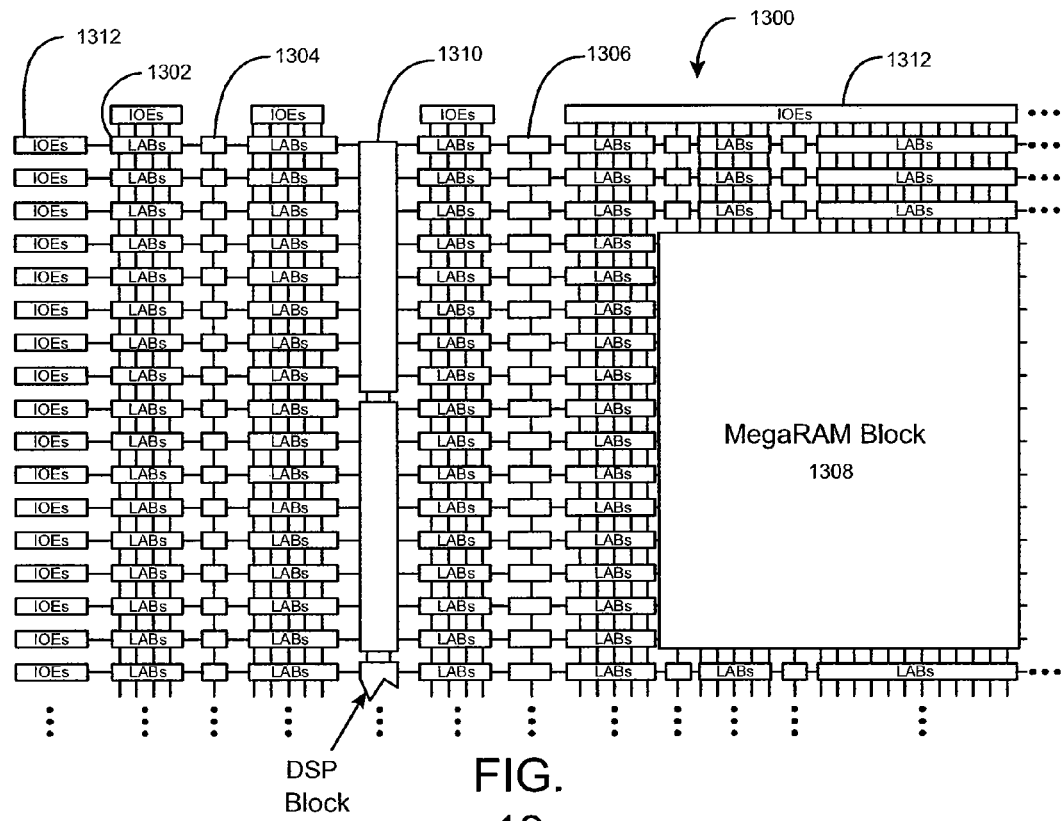
FIG. 13 is a simplified block diagram of a programmable logic device that does benefit by incorporating embodiments of the present invention.

FIG. 13 is a simplified partial block diagram of an exemplary high-density programmable logic device 1300 wherein techniques according to the present invention can be utilized. PLD 1300 includes a two-dimensional array of programmable logic array blocks (or LABs) 1302 that are interconnected by a network of column and row interconnections of varying length and speed. LABs 1302 include multiple (e.g., 10) logic elements (or LEs), an LE being a small unit of logic that provides for efficient implementation of user defined logic functions.

PLD 1300 also includes a distributed memory structure including RAM blocks of varying sizes provided throughout the array. The RAM blocks include, for example, 512 bit blocks 1304, 4K blocks 1306 and an M-Block 1308 providing 512K bits of RAM. These memory blocks may also include shift registers and FIFO buffers. PLD 1300 further includes digital signal processing (DSP) blocks 1310 that can implement, for example, multipliers with add or subtract features.

It is to be understood that PLD 1300 is described herein for illustrative purposes only and that the present invention can be implemented in many different types of PLDs, FPGAs, and the other types of logic circuits.

Figure 14:
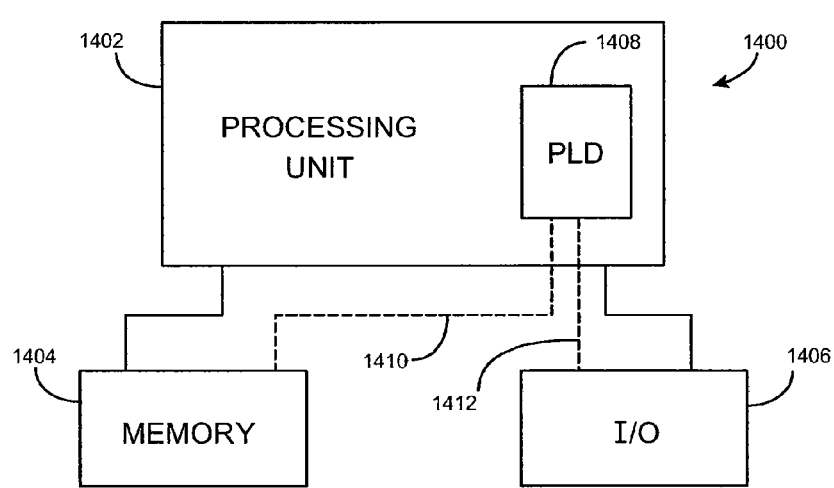
FIG. 14 is a block diagram of an electronic system that does benefit by incorporating embodiments of the present invention.

While PLDs of the type shown in FIG. 13 provide many of the resources required to implement system level solutions, the present invention can also benefit systems wherein a PLD is one of several components. FIG. 14 shows a block diagram of an exemplary digital system 1400, within which the present invention may be embodied. System 1400 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 1400 may be provided on a single board, on multiple boards, or within multiple enclosures.

System 1400 includes a processing unit 1402, a memory unit 1404 and an I/O unit 1406 interconnected together by one or more buses. According to this exemplary embodiment, a programmable logic device (PLD) 1408 is embedded in processing unit 1402. PLD 1408 may serve many different purposes within the system in FIG. 14. PLD 1408 can, for example, be a logical building block of processing unit 1402, supporting its internal and external operations. PLD 1408 is programmed to implement the logical functions necessary to carry on its particular role in system operation. PLD 1408 may be specially coupled to memory 1404 through connection 1410 and to I/O unit 1406 through connection 1412.

Processing unit 1402 may direct data to an appropriate system component for processing or storage, execute a program stored in memory 1404 or receive and transmit data via I/O unit 1406, or other similar function. Processing unit 1402 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 1408 can control the logical operations of the system. In an embodiment, PLD 1408 acts as a reconfigurable processor, which can be reprogrammed as needed to handle a particular computing task. Alternately, programmable logic device 1408 may itself include an embedded microprocessor. Memory unit 1404 may be a random access memory (RAM), read only memory (ROM), fixed or flexible disk media, PC Card flash disk memory, tape, or any other storage means, or any combination of these storage means.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit having a programmable delay element, wherein the programmable delay element comprises:
   a plurality of delay components arranged in series, each including:
      a single delay stage that has only one delay sub-element for which the amount of delay is variable;
      a first delay tap before the single delay stage and a final delay tap after the single delay stage; and
      a signal selection circuit having a plurality of inputs, the signal selection circuit having an output selectively coupled with one of the inputs in response to data select inputs, wherein a first input of the signal selection circuit is coupled with the first delay tap and a second input of the signal selection circuit is coupled with the final delay tap; and
   wherein the output of the signal selection circuit of a component is coupled with the first delay tap of a successive component, wherein a total delay of the programmable delay element is collectively defined by the data select inputs of the signal selection circuits, and wherein an amount of delay for the delay stage of one component is different from an amount of delay for the delay stage of a second component.

2. The integrated circuit of claim 1, wherein the amount of delay for the delay stage of the one component is different than an amount of delay for the delay stage of every other component.

3. The integrated circuit of claim 2, wherein an amount of delay for the delay stage of each component is different than an amount of delay for the delay stage of any other component.

4. The integrated circuit of claim 3, wherein the amounts of the delays of the components differ by powers of a constant.

5. The integrated circuit of claim 4, wherein the constant is 2.

6. The integrated circuit of claim 1, further comprising a delay sub-element between the output of the signal selection circuit of a component and the first delay tap of a successive component.

7. The integrated circuit of claim 1, wherein the delay stage of a component comprises a gating element capable of suppressing an operation of the only variable delay sub-element of that component.

8. The integrated circuit of claim 7, wherein the gating element is at the beginning of the delay stage.

9. The integrated circuit of claim 1, wherein at least one of the single delay stages comprises a current-starved inverter or buffer.

10. The integrated circuit of claim 1, wherein at least one of the single delay stages comprises a programmable load.

11. The integrated circuit of claim 1, wherein the programmable delay element is within an input and output block.

* * * * *